United States Patent [19]

Tien et al.

[11] Patent Number: 4,861,685
[45] Date of Patent: Aug. 29, 1989

[54] PORTABLE RECHARGEABLE BATTERY

[76] Inventors: Spencer W. H. Tien, 11921 Goldring Rd., Arcadia, Calif. 91006; Ronnie A. Matheny, 19731 Jalora St., Corona, Calif. 91719

[21] Appl. No.: 234,138

[22] Filed: Aug. 19, 1988

[51] Int. Cl.⁴ .................... H01M 14/00; H01M 10/48
[52] U.S. Cl. .......................................... 429/7; 429/92; 429/93; 320/48
[58] Field of Search .................. 429/7, 92, 93; 320/48

[56] References Cited

U.S. PATENT DOCUMENTS

| | | | |
|---|---|---|---|
| 4,019,112 | 4/1977 | Satoh | 320/48 |
| 4,117,203 | 9/1978 | Sjogren | 429/7 |

FOREIGN PATENT DOCUMENTS

| | | | |
|---|---|---|---|
| 3100503 | 8/1982 | Fed. Rep. of Germany | 429/92 |
| 58-147973 | 9/1983 | Japan | 429/92 |
| 862274 | 9/1981 | U.S.S.R. | 429/92 |

*Primary Examiner*—Stephen J. Kalafut
*Attorney, Agent, or Firm*—Edward J. DaRin

[57] ABSTRACT

A rechargeable battery having a housing storing a rechargeable battery means and including a battery charge transfer measuring circuit within the battery housing. The battery means and the measuring circuit are sealed in the housing and are connectable to an external power pack for charging the discharged battery means. The measuring circuit controls signaling means visible from outside of the housing for signaling a charging condition to a fully charged condition of the housed battery means.

17 Claims, 2 Drawing Sheets

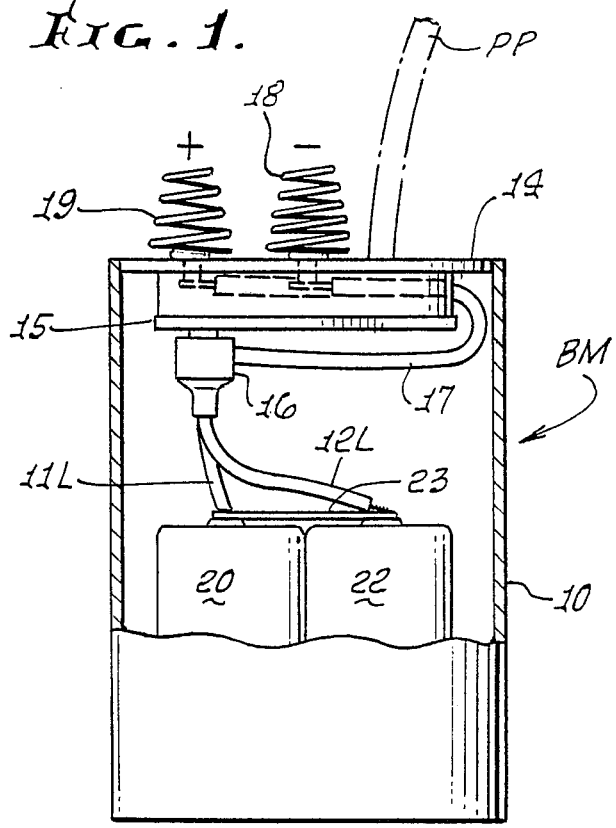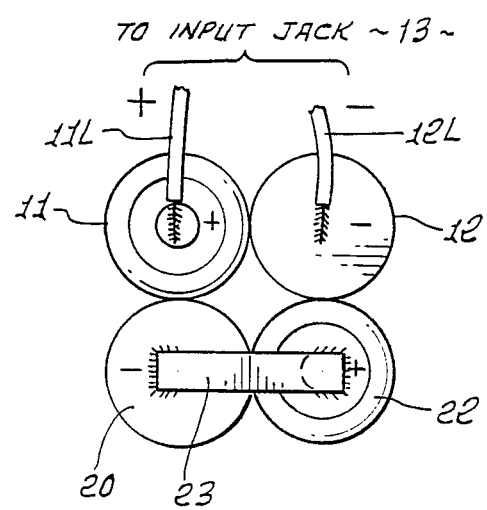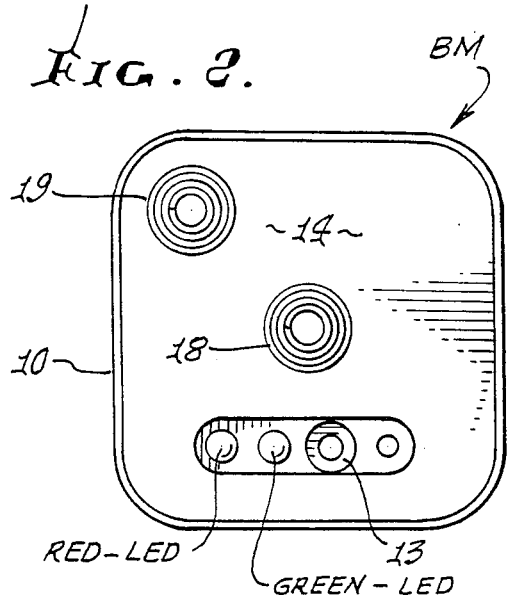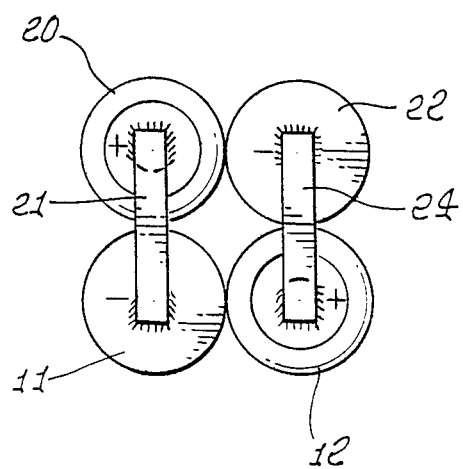

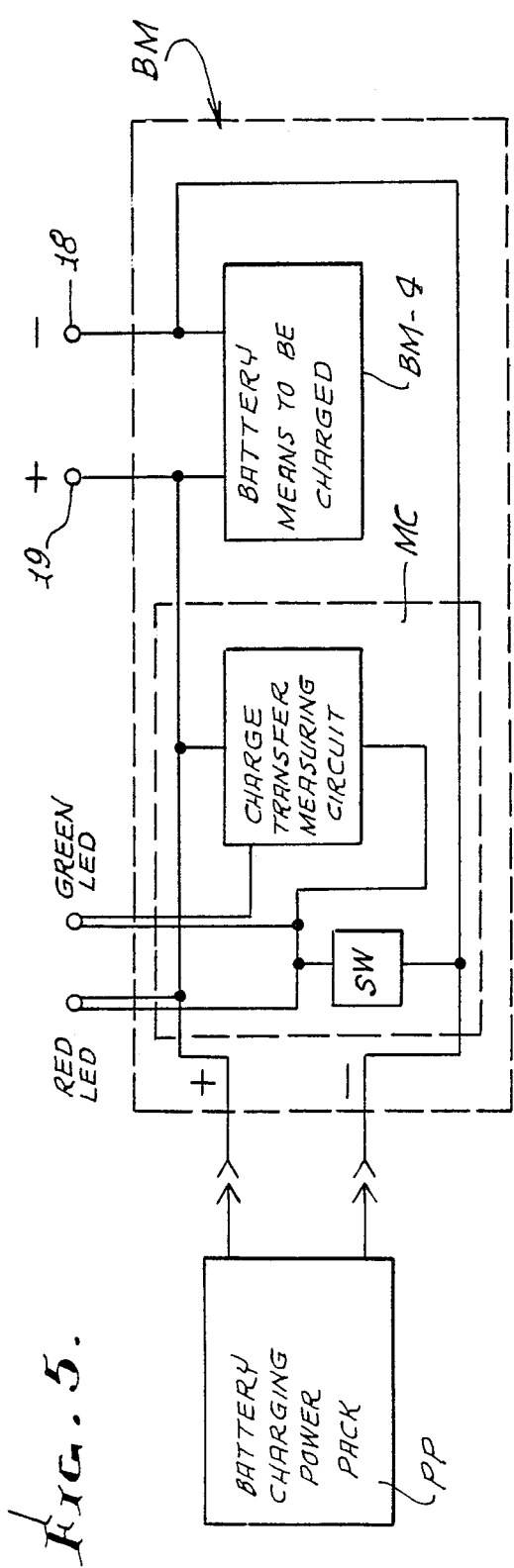
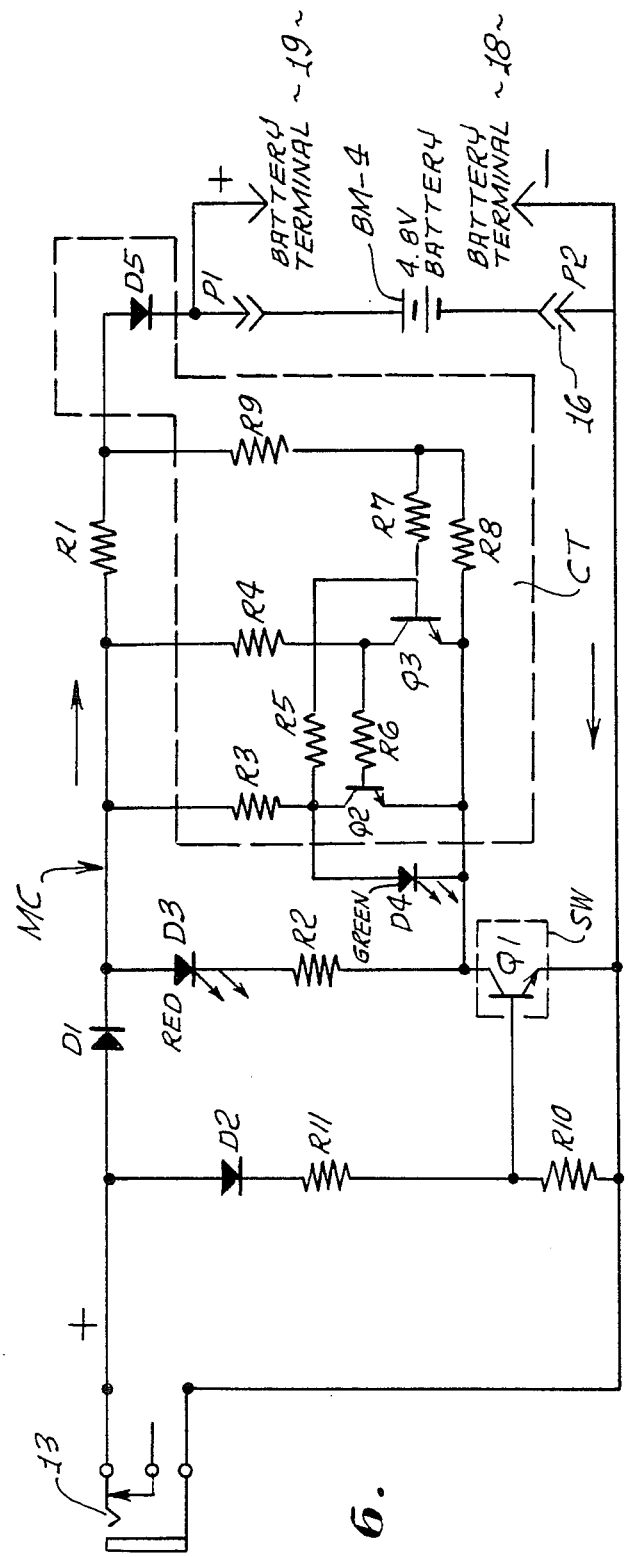
Fig. 5.
Fig. 6.

PORTABLE RECHARGEABLE BATTERY

FIELD OF INVENTION

This invention relates to a portable rechargeable battery having charging control circuit means housed therewith to permit the battery to be recharged and reused a large number of times.

BACKGROUND OF INVENTION

At the present time there are commercially available portable batteries of various constructions that are in use. These batteries include carbon-zinc batteries, alkaline, spring terminal batteries, nickel-cadmium batteries and similar constructed low voltage batteries. Almost all of these known types of batteries are termed "throw away" as once the charge is depleted in the batteries, they cannot be recharged and therefore are thrown away and must be replaced by new batteries. There is, therefore, a present need for a cost effective replacement for such batteries and, in particular, for 6.0 volt carbon-zinc and alkaline spring terminal batteries. Various electronic control circuits per se are known in the art for monitoring the current applied during the charging of discharged storage batteries but no known combination of battery means and charging control circuit means arranged within the housing for a rechargeable battery are presently known.

SUMMARY OF INVENTION

The present invention provides an improved battery means having a housing for the battery means and control circuitry built into the housing for controlling or monitoring the charging of the battery means from an external power source to permit the battery means to be recharged up to 1,000 times or more before discarding the battery and thereby providing a significant cost advantage over existing batteries of the "throw away" variety or non-rechargeable batteries. The control circuit built into the housing for the purposes of the present invention is adapted to be operable from an AC or a DC source connectable to the battery housing and automatically signals the charging state or fully charged condition of the battery. The automatic solid state switching circuitry within the housing in accordance with the present invention removes the load of the switching circuit when the power pack or charging current source is removed therefrom, thereby providing longer storage life of the battery means. This feature of the circuitry of the present invention causes the storage life to be approximately the same as for a battery means with nothing connected thereto. The housing itself can be constructed of a high impact, plastic case with external dimensions and configuration allowing the improved battery to be used as a replacement for existing "throw away" batteries. The case is preferably sealed except for a power input jack by means of a rubber dust cover or the like to prevent dust and moisture from entering the case.

From a structural standpoint, the rechargeable battery of the present invention comprises a housing, rechargeable battery means having positive and negative direct current terminals arranged in the housing with the terminals being connectable from outside the housing for powering of a device connected thereto. The housing includes circuit means arranged therein and connected to the battery terminals for connecting a power source thereto to cause a charging current to flow into the battery means in the reverse direction from which current normally flows from the battery means. This circuit means has terminals accessible on the outside of the housing for permitting a battery charging power pack to be coupled thereto for charging the battery means. Measuring circuit means is coupled to the battery means for sensing the amount of charge or current transferred to the battery means from the power pack connected to the circuit means in a battery charging relationship. Signaling means are coupled with the measuring circuit means to be responsive to the measuring circuit means when it senses that the charge transferred to the battery means has recharged the battery means and automatically signals the charged condition. The measuring circuit means is essentially decoupled from the battery means when the battery charging power pack is disconnected therefrom to thereby remove any current drain on the battery means. Means for automatically signaling the coupling of the charging power pack to the circuit means in a charging relationship is provided in the housing and signals the charging condition on the outside of the housing. The signaling means may also include the means for signaling the completed charging cycle of the battery means to the user.

BRIEF DESCRIPTION OF THE DRAWINGS

These and other features of the present invention may be more fully appreciated when considered in the light of the following specification and drawings in which:

FIG. 1 is a partial cross-section and elevational view of the rechargeable battery means embodying the present invention and illustrating in dotted outline the connection to a power pack for charging the battery means;

FIG. 2 is a top plan view of the housing for the battery means of FIG. 1;

FIG. 3 is a diagrammatic representation of the top sides of a series of connected individual batteries comprising the battery means removed from the battery housing as viewed in FIG. 1;

FIG. 4 is a diagrammatic representation of the bottom side of the series of connected individual battery means connected in series circuit relationship or the opposite end of the battery means from that illustrated in FIG. 3;

FIG. 5 is a general block diagram of the rechargeable battery means of FIG. 1 and illustrating the coupling to the charging power pack therefor; and FIG. 6 is a schematic circuit diagram of the charge measuring circuit means of FIG. 5 illustrated as it would be connected to the battery means.

DETAILED DESCRIPTION OF THE PREFERRED EMBODIMENT OF THE INVENTION

Now referring to the drawings, the detailed description of the portable, rechargeable battery means BM will be described in detail. The invention will be described as it may be embodied for charging an alkali (nickel-cadmium) spring terminal battery means BM, but the battery means may be any type of battery means, such as a carbon-zinc, lead acid, alkaline cell or any other type of rechargeable battery. The battery means, in accordance with the present invention, will be described as comprising four individual nickel-cadmium rechargeable cells that are arranged side by side in an electrical circuit relationship and stored within the battery housing 10, as is evident from examining FIG. 1. Each nickel-cadmium cell has a terminal voltage of approximately 1.41 volts. The four batteries are connected in series circuit relationship as arranged within the housing 10, and this electrical circuit relationship can be appreciated from examining FIGS. 3 and 4. Two of the batteries, namely, the batteries 11 and 12, as illustrated in FIG. 3, have their terminals connected to lead wires 11L and 12L for connection to a power pack PP through the input jack 13 mounted to the top cover of the housing 10 or the cover 14, as best illustrated in FIG. 2. The terminal lead wires 11L and 12L are connected to a connector secured to a printed circuit board 15 mounted immediately below the cover 14 for the housing 10, as best illustrated in FIG. 1. Each lead wire 11L and 12L is connected by an individual connector, such as the connector 16 illustrated in FIG. 1 for the lead wire 12L, and from the connector 16 a further lead wire such as the lead wire 17 is arranged under the printed circuit board 15 and over the top thereof to one of the spring terminals arranged and secured to the top side of the housing 10 on the top cover 14. For this purpose the spring terminal 18 is connected to the lead wire 17 and which terminal 18 is the negative terminal for the battery means BM. The other spring terminal 19 is the positive terminal for the battery means BM and is similarly arranged with another lead wire (not shown) connected to lead wire 11L. It will be readily recognized that a device to be powered from the battery means BM will be connected to the terminals 18 and 19. The disconnection of the lead wires 11L and 12L from their individual connectors on the printed circuit board 15 allows the four batteries to be replaced.

For the purposes of arranging the individual nickel-cadmium batteries in a series circuit relationship, it will be appreciated by those skilled in the art that the positive and negative terminals for the batteries as commercially constructed have the positive and negative terminals at the opposite ends thereof. As illustrated in FIG. 3, the battery 11 has its top terminal or its positive terminal connected to the lead wire 11L. The negative terminal for the battery 11 on the bottom side of the battery is connected to a further battery 20 that has its positive terminal arranged on its bottom side as arranged in the housing 10 and is connected from the negative terminal of the battery 11 to the positive terminal of the battery 20 by means of a connecting conductive strap 21, which may be a thin piece of copper that is secured to the terminals of the batteries 11 and 20 by soldering, as illustrated in FIG. 4. Accordingly, the negative terminal for the battery 20, which is visible in FIG. 3, is connected to the positive terminal of the battery 22 arranged adjacent thereto, and these two batteries are also connected by means of a conductive strap 23 secured to the negative terminal of the battery 20 and the positive terminal of the battery 22 by soldering. The negative terminal of the battery 22 is arranged on the bottom side of the housing 10 and which terminal is connected to the positive terminal of the battery 12 by means of the conductive strap 24 to complete the series circuit; see FIG. 4. The negative terminal for the battery 12 is connected to the lead wire 12L as described hereinabove. To trace the circuit, it will be seen that the battery 11 has its negative terminal connected to the positive terminal for the battery 20, as illustrated in FIG. 4, and the negative terminal for the battery 20 is connected to the positive terminal of the battery 22, as illustrated in FIG. 3, and the negative terminal of the battery 22 is connected by means of the strap 24 to the positive terminal of the battery 12. The battery lead wires 11L and 12L are arranged in series circuit relationship with their respective terminals 19 and 18 functioning as the positive and negative terminals for the battery means BM, as illustrated in FIG. 1.

The general arrangement of the circuit means mounted on the printed circuit board 15 is shown in FIG. 5. The battery charging power pack PP is shown as being connectable and disconnectable through the plug-in jack 13 to the measuring circuit means arranged on the printed circuit board 15. For this purpose the battery means to be charged or the four nickel-cadmium cells 11, 12, 20 and 22 are identified in block form as the battery means BM-4 with the positive and negative terminals emanating therefrom representative of the terminals 19 and 18, respectively. Between the battery charging power pack PP and the battery means BM-4, there is a charge transfer measuring circuit MC that is connected between the positive input terminal of the power pack PP and the negative terminal thereof. The charge transfer measuring circuit MC is arranged with a pair of light emitting diodes for signaling the charging condition of the battery means BM-4 and the fully charged condition of the battery means. The light emitting diodes are arranged to be responsive to an individual conductive state of the charge transfer measuring circuit MC for signaling their respective functions. The red LED, when energized, will signal that the power pack PP has been applied to the battery means BM-4 for charging and the battery means is undergoing charging. When the battery means BM-4 has been fully charged, the measuring circuit will have sensed this condition and switched its conductive state to cause the red LED to be de-energized and to energize the green LED to signal that the battery BM-4 has been fully charged. The red and green light emitting diodes are mounted in the top cover 14 to be visible therefrom. The diodes signal to the user the charging condition of the battery BM-4 or the fully charged condition based on the illumination of the red or green light emitting diode, which is apparent from examining FIG. 2.

The power pack PP may comprise several different types of alternating current, AC, or direct current, DC, sources. The AC source may be, for example, an A.C. wall transformer. The DC source may be a D.C. wall transformer, 12.0 volt, electric storage battery or a bench type 12.0 V power supply. The power pack PP is preferable within the range of 7.5-10 volts of direct current providing 150 milliamperes of current.

Now referring to FIG. 6, the detailed circuit diagram of the charge transfer measuring circuit means MC will be described in detail. The power pack PP will be coupled to the measuring circuit through the jack 13 arranged on the top cover 14 as previously described. Accordingly, one terminal of the jack will be considered the positive terminal, as illustrated in FIG. 6, while the other terminal will be considered the negative terminal. When a DC source is aapplied to the jack 13, the positive voltage will be applied to the anodes of the diodes D1 and D2 arranged at the input circuit for the measuring circuit means MC. The negative voltage is applied to the negative terminal on the circuit board, as illustrated in FIG. 6. The current path through the four batteries BM-4 to be charged is through the diode D1, the series resister R1, and the diode D5, and through the batteries BM-4 underoing charging and to the negative terminal of the jack 13.

The input diode D1 is directly connected to the positive terminal of the jack 13 to provide reverse polarity protection for the measuring circuit MC and to provide rectification of the input voltage from the power pack PP when the power pack is an AC source. The resister R1 connected in series circuit relationship between the diode D1 and the diode D5 is provided to limit the input current to a safe value for the battery cells undergoing charging. The diode D5 in the input circuit to the cells undergoing charging provides isolation of the cells when the power pack PP is disconnected from the jack 13. The diode D2 is connected across the power source from the positive terminal of the circuitry to the negative terminal through a pair of series resisters R11 and R10, as illustrated in FIG. 6. The diode D2 is arranged to provide rectification of the voltages from the power pack PP when an AC source is used for charging and to provide reverse polarity protection when a direct current source is used. The transistor switch Q1 is connected in the charge transfer measuring circuit MC for controlling the energization of the measuring circuit by switching to a conductive state and thereby the illumination of the red light emitting diode D3. This diode D3, then, is turned on when the power is applied to the jack 13 to signal the charging of the battery cells, as will become apparent immediately hereinafter. The transistor Q1 also provides additional isolation from the battery cells when the power pack PP is disconnected.

Now referring to the charge transfer measuring circuit CT per se, in particular, in the detail illustrated in FIG. 6, it will be noted that it comprises a pair of transistors Q2 and Q3 arranged in a bistable relationship and functions as a combination measuring and indicator circuit, which controls the energization and de-energization of the green light emitting diode D4. The transistors Q2 and Q3 are arranged with a precision voltage dividing circuit comprising the resisters R8 and R9. The resister R9 is connected to the base electrode for the transistor Q3 through the resister R7 and in series circuit relationship with the resister R8 to the emitter electrode for the transistor Q3. In this fashion the base electrode of the transistor Q3 is connected to the battery cells undergoing charging through the diode D5 and resister R9. The transistor Q2 is coupled to the transistor Q3 by means of the resister R6 which is connected from the base electrode of the transistor Q2 to the collector electrode of the transistor Q3. A series resister R4 is connected directly between the diode D1 and the resister R1 to the collector electrode of the transistor Q3. Similarly, the collector electrode for the transistor Q2 is connected to the resister R3 to the junction between the diode D1 and resister R1. A feedback resister R5 is arranged in circuit relationship from the collector electrode for the transistor Q2 to the base electrode of the transistor Q3. The green light emitting diode D4 is connected from the collector electrode of the transistor Q2 to the emitter electrode for transistor Q2 and the collector electrode for the transistor Q1. The switching transistor Q1 has its emitter electrode connected directly to the negative terminal for the circuit, as illustrated in FIG. 6. The base electrode for the transistor Q1 is connected between the series resisters R11 and R10 arranged with the diode D2 across the power source. The red light emitting diode D3 is connected from between the diode D1 through the resister R2 to the collector electrode of the transistor Q1.

The circuit MC is energized when the power pack PP is plugged into the jack 13. At this time, the transistor Q2 is rendered conductive along with the transistor Q1 and the red light emitting diode D3. The transistor Q3 is in a nonconductive state at this time along with the diode D4. The illumination of the diode D3 signals that the battery cells BM-4 are undergoing charging.

When the voltage of the battery cells undergoing charging rises to a level of approximately 6.0 volts (5.8 to 6.1), the transistor Q3 will begin to conduct and its collector voltage will commence to move towards zero volts. As this transition begins, the transistor Q2, which was initially turned on, begins to turn off, allowing its collector voltage to rise. As a result of the positive feedback from the transistor Q2 to the transistor Q3 through the resister R5, the transistor Q3 will be caused to latch or be switched to an "ON" or conductive state and the transistor Q2 to latch in a non-conductive or "OFF" state. When the transistor Q2 turns to a nonconductive condition, the green light emitting diode D4 will become energized, indicating the full charge of the cells BM-4. The cells BM-4 will become substantially fully charged in 10–14 hours. The power pack PP can be removed from the circuit MC at this time. When the power pack PP is disconnected, the circuit CT switching action will remove the load of the circuit from the cells BM-4 to thereby extend the useful life of the cells.

We claim:

1. A rechargeable battery comprising a housing, rechargeable battery means having positive and negative direct current terminals arranged in the housing and the terminals connectable from outside the housing for powering a device connected to the terminals, circuit means arranged within the housing and connected to the battery means terminals for connecting a power source thereto to cause a charging current to flow into the battery means in the reverse direction from which current normally flows from the battery means, said circuit means having terminals accessible on the outside of the housing for permitting a battery charging power pack to be coupled thereto for charging the battery means, measuring circuit means coupled to the battery means for sensing the amount of charge or current transferred to the battery means from a power pack connected to the circuit means in a battery charging relationship, and signaling means coupled with the measuring circuit means to be responsive to the measuring circuit means when it senses that the charge transferred to the battery means has recharged the battery means and automatically signals the charged condition, said measuring circuit means being essentially de-coupled from the battery means when the battery charging power pack is disconnected therefrom to thereby remove any current drain on the battery means.

2. A rechargeable battery as defined in claim 1 including means for automatically signaling the coupling of a charging power pack to the circuit means in a charging relationship and signaling the charging condition on the outside of the housing.

3. A rechargeable battery as defined in claim 1 wherein said rechargeable battery means comprises a plurality of individual, rechargeable batteries connected in a series circuit relationship.

4. A rechargeable battery as defined in claim 3 wherein the individual batteries are nickel-cadmium batteries.

5. In combination with a rechargeable battery as defined in claim 1, a power pack adapted to be readily connected and disconnected to the battery means terminals for charging the battery means and connected to the circuit means terminals accessible on the outside of said housing during charging of the battery means.

6. The combination as defined in claim 5 wherein the power pack is a direct current or alternating current power source.

7. A rechargeable battery as defined in claim 1 wherein said measuring circuit means comprises transistor switching circuit means connected between the battery means and a connectable power source for sensing the charging of the battery means during charging and being switchably responsive to the battery means being substantially fully charged to switch into another switching state indicative of a substantially full charge.

8. A rechargeable battery as defined in claim 7 including signaling means visible on the outside of the housing to be responsive to the states of said switching circuit means for signaling the charging condition of the battery means or the fully charged condition of the battery means in accordance with the states of switching circuit means.

9. A rechargeable battery as defined in claim 8 wherein said signaling means comprises individual light emitting diodes connected to the transistor switching circuit means to be responsive to one of the switching states thereof to be energized in accordance with the energization and de-energization of the states of the switching circuit means.

10. A rechargeable battery comprising a housing, rechargeable battery means having positive and negative direct current terminals arranged in the housing and the terminals connectable from outside the housing for powering a device connected to the terminals, circuit means arranged within the housing and connected to the battery means terminals for connecting a power source thereto to cause a charging current to flow into the battery means in the reverse direction from which current normally flows from the battery means, said circuit means having terminals accessible on the outside of the housing for permitting a battery charging power pack to be coupled thereto for charging the battery means, measuring circuit means coupled to the battery means for sensing the amount of charge or current transferred to the battery means from a power pack connected to the circuit means in a battery charging relationship, and signaling means coupled with the measuring circuit means to be responsive to the measuring circuit means when it senses that the charge transferred to the battery means has recharged the battery means and automatically signals the charged conditon.

11. A rechargeable battery as defined in claim 10 including means for automatically signaling the coupling of a charging power pack to the circuit means in a charging relationship and signaling the charging condition on the outside of the housing.

12. A rechargeable battery as defined in claim 10 wherein said measuring circuit means comprises transistor switching circuit means connected between the battery means and a connectable power source for sensing the charging of the battery means during charging and being switchably responsive to the battery means being substantially fully charged to switch into another switching state indicative of a substantially full charge.

13. A rechargeable battery as defined in claim 12 including signaling means visible on the outside of the housing to be responsive to the states of said switching circuit means for signaling the charging condition of the battery means or the fully charged condition of the battery means in accordance with the states of the switching circuit means.

14. A rechargeable battery as defined in claim 13 wherein said signaling means comprises individual light emitting diodes connected to the transistor switching circuit means to be responsive to one of the switching states thereof to be energized in accordance with the energization and de-energization of the states of the switching circuit means.

15. A rechargeable battery as defined in claims 1 or 10 including input jack means integrally mounted to the housing to be accessible on the outside of the housing for readily connecting and disconnecting a power pack adapted for charging the battery means thereto.

16. A rechargeable battery as defined in claim 1 wherein said positive and negative direct current terminals are accessible from the outside of the top of the housing and including input jack means mounted adjacent to said terminals on the top of the housing and accessible from the top of the housing for connecting and disconnecting a power pack adapted for charging the battery means thereto.

17. A rechargeable battery as defined in claim 10 wherein said positive and negative direct current terminals are accessible from the outside of the top of the housing and including input jack means mounted adjacent to said terminals on the top of the housing and accessible from the top of the housing for connecting and disconnecting a power pack adapted for charging the battery means thereto.

* * * * *